(12) United States Patent
Cho et al.

(10) Patent No.: US 7,892,985 B1
(45) Date of Patent: Feb. 22, 2011

(54) METHOD FOR POROGEN REMOVAL AND MECHANICAL STRENGTH ENHANCEMENT OF LOW-K CARBON DOPED SILICON OXIDE USING LOW THERMAL BUDGET MICROWAVE CURING

(75) Inventors: Seon-Mee Cho, San Jose, CA (US); George D. Papasouliotis, Sunnyvale, CA (US); Mike Barnes, San Ramon, CA (US)

(73) Assignee: Novellus Systems, Inc., San Jose, CA (US)

( * ) Notice: Subject to any disclaimer, the term of this patent is extended or adjusted under 35 U.S.C. 154(b) by 1186 days.

(21) Appl. No.: 11/280,113

(22) Filed: Nov. 15, 2005

(51) Int. Cl.
*H01L 21/4757* (2006.01)

(52) U.S. Cl. .................... 438/781; 427/255.6; 427/553; 257/E21.242; 257/E21.576

(58) Field of Classification Search ................. 438/623, 438/781; 427/553, 255.6; 257/E21.242, 257/E21.576
See application file for complete search history.

(56) References Cited

U.S. PATENT DOCUMENTS

| | | |
|---|---|---|
| 3,983,385 A | 9/1976 | Troue |
| 4,357,451 A | 11/1982 | McDaniel |
| 4,882,008 A | 11/1989 | Garza et al. |
| 4,885,262 A | 12/1989 | Ting et al. |
| 5,504,042 A | 4/1996 | Cho et al. |
| 5,686,054 A | 11/1997 | Barthel et al. |
| 5,700,844 A | 12/1997 | Hedrick et al. |
| 5,789,027 A | 8/1998 | Watkins et al. |
| 5,849,640 A | 12/1998 | Hsia et al. |
| 5,851,715 A | 12/1998 | Barthel et al. |
| 5,858,457 A | 1/1999 | Brinker et al. |
| 5,920,790 A | 7/1999 | Wetzel et al. |
| 6,051,283 A * | 4/2000 | Lee et al. .................... 427/553 |

(Continued)

FOREIGN PATENT DOCUMENTS

JP 63076335 4/1988

(Continued)

OTHER PUBLICATIONS

Cho et al., "Plasma Treatments of Molecularly Templated Nanoporous Silica Films," Electrochemical and Solid-State Letters, 4 (4) G35-G38 (2001).

(Continued)

*Primary Examiner*—Mary Wilczewski
*Assistant Examiner*—Toniae M Thomas
(74) *Attorney, Agent, or Firm*—Weaver Austin Villeneuve & Sampson LLP (57) ABSTRACT

Improved methods for preparing a low-k dielectric material on a substrate using microwave radiation are provided. The use of microwave radiation allows the preparation of low-k films to be accomplished at low temperatures. According to various embodiments, microwave radiation is used to remove porogen from a precursor film and/or to increase the strength of the resulting porous dielectric layer. In a preferred embodiment, methods involve (a) forming a precursor film that contains a porogen and a structure former on a substrate, (b) exposing the precursor film to microwave radiation to remove the porogen from the precursor film to thereby create voids within the dielectric material and form the porous low-k dielectric layer and (c) exposing the dielectric material to microwave radiation in a manner that increases the mechanical strength of the porous low-k dielectric layer.

19 Claims, 5 Drawing Sheets

U.S. PATENT DOCUMENTS

| | | | |
|---|---|---|---|
| 6,140,252 | A | 10/2000 | Cho et al. |
| 6,149,828 | A | 11/2000 | Vaartstra |
| 6,171,661 | B1 | 1/2001 | Zheng et al. |
| 6,177,329 | B1 | 1/2001 | Pang |
| 6,232,658 | B1 | 5/2001 | Catabay et al. |
| 6,258,735 | B1 | 7/2001 | Xia et al. |
| 6,268,276 | B1 | 7/2001 | Chan et al. |
| 6,268,288 | B1 | 7/2001 | Hautala et al. |
| 6,270,846 | B1 | 8/2001 | Brinker et al. |
| 6,271,273 | B1 | 8/2001 | You et al. |
| 6,306,564 | B1 | 10/2001 | Mullee |
| 6,312,793 | B1 | 11/2001 | Grill et al. |
| 6,329,017 | B1 | 12/2001 | Liu et al. |
| 6,329,062 | B1 | 12/2001 | Gaynor |
| 6,331,480 | B1 | 12/2001 | Tsai et al. |
| 6,340,628 | B1 | 1/2002 | Van Cleemput et al. |
| 6,365,266 | B1 | 4/2002 | MacDougall et al. |
| 6,383,466 | B1 | 5/2002 | Domansky et al. |
| 6,383,955 | B1 | 5/2002 | Matsuki et al. |
| 6,386,466 | B1 | 5/2002 | Ozawa et al. |
| 6,387,453 | B1 | 5/2002 | Brinker et al. |
| 6,391,932 | B1 | 5/2002 | Gore et al. |
| 6,392,017 | B1 | 5/2002 | Chandrashekar |
| 6,420,441 | B1 | 7/2002 | Allen et al. |
| 6,444,715 | B1 | 9/2002 | Mukherjee et al. |
| 6,455,417 | B1 | 9/2002 | Bao et al. |
| 6,479,374 | B1 | 11/2002 | Ioka et al. |
| 6,479,409 | B2 | 11/2002 | Shioya et al. |
| 6,500,770 | B1 | 12/2002 | Cheng et al. |
| 6,548,113 | B1 | 4/2003 | Birnbaum et al. |
| 6,558,755 | B2 | 5/2003 | Berry et al. |
| 6,573,030 | B1 | 6/2003 | Fairbairn et al. |
| 6,576,300 | B1 | 6/2003 | Berry et al. |
| 6,576,345 | B1 | 6/2003 | Cleemput et al. |
| 6,596,467 | B2 | 7/2003 | Gallagher et al. |
| 6,596,654 | B1 | 7/2003 | Bayman et al. |
| 6,610,362 | B1 | 8/2003 | Towle |
| 6,632,478 | B2 | 10/2003 | Gaillard et al. |
| 6,667,147 | B2 | 12/2003 | Gallagher et al. |
| 6,677,251 | B1 | 1/2004 | Lu et al. |
| 6,715,498 | B1 | 4/2004 | Humayun et al. |
| 6,740,602 | B1 | 5/2004 | Hendriks et al. |
| 6,756,085 | B2 | 6/2004 | Waldfried et al. |
| 6,759,098 | B2 | 7/2004 | Han et al. |
| 6,797,643 | B2 | 9/2004 | Rocha-Alvarez et al. |
| 6,805,801 | B1 | 10/2004 | Humayun et al. |
| 6,812,043 | B2 | 11/2004 | Bao et al. |
| 6,815,373 | B2 | 11/2004 | Singh et al. |
| 6,831,284 | B2 | 12/2004 | Demos et al. |
| 6,846,380 | B2 | 1/2005 | Dickinson et al. |
| 6,848,458 | B1 | 2/2005 | Shrinivasan et al. |
| 6,849,549 | B1 | 2/2005 | Chiou et al. |
| 6,867,086 | B1 | 3/2005 | Chen et al. |
| 6,903,004 | B1 | 6/2005 | Spencer et al. |
| 6,914,014 | B2 | 7/2005 | Li et al. |
| 6,921,727 | B2 | 7/2005 | Chiang et al. |
| 6,943,121 | B2 | 9/2005 | Leu et al. |
| 7,018,918 | B2 | 3/2006 | Kloster et al. |
| 7,087,271 | B2 | 8/2006 | Rhee et al. |
| 7,094,713 | B1 | 8/2006 | Niu et al. |
| 7,148,155 | B1 | 12/2006 | Tarafdar et al. |
| 7,166,531 | B1 | 1/2007 | van den Hoek et al. |
| 7,176,144 | B1 * | 2/2007 | Wang et al. ................ 438/759 |
| 7,208,389 | B1 | 4/2007 | Tipton et al. |
| 7,241,704 | B1 | 7/2007 | Wu et al. |
| 7,253,125 | B1 * | 8/2007 | Bandyopadhyay et al. .. 438/795 |
| 7,265,061 | B1 * | 9/2007 | Cho et al. ................ 438/764 |
| 7,297,608 | B1 | 11/2007 | Papasouliotis et al. |
| 7,332,445 | B2 | 2/2008 | Lukas et al. |
| 7,381,659 | B2 | 6/2008 | Nguyen et al. |
| 7,390,537 | B1 | 6/2008 | Wu et al. |
| 7,510,982 | B1 | 3/2009 | Draeger et al. |
| 7,557,035 | B1 * | 7/2009 | Ryan et al. ................ 438/638 |
| 7,589,028 | B1 | 9/2009 | Cho et al. |
| 7,629,224 | B1 | 12/2009 | Van Den Hoek et al. |
| 2002/0001973 | A1 | 1/2002 | Wu et al. |
| 2002/0016085 | A1 | 2/2002 | Huang et al. |
| 2002/0034626 | A1 | 3/2002 | Liu et al. |
| 2002/0064341 | A1 | 5/2002 | Fauver et al. |
| 2002/0094388 | A1 | 7/2002 | Fonash et al. |
| 2002/0106500 | A1 | 8/2002 | Albano et al. |
| 2002/0123240 | A1 | 9/2002 | Gallagher et al. |
| 2002/0141024 | A1 | 10/2002 | Retschke et al. |
| 2002/0172766 | A1 | 11/2002 | Laxman et al. |
| 2002/0192980 | A1 | 12/2002 | Hogle et al. |
| 2003/0064607 | A1 | 4/2003 | Leu et al. |
| 2003/0066544 | A1 | 4/2003 | Jur et al. |
| 2003/0119307 | A1 | 6/2003 | Bekiaris et al. |
| 2003/0157248 | A1 | 8/2003 | Watkins et al. |
| 2003/0198742 | A1 * | 10/2003 | Vrtis et al. ............. 427/255.28 |
| 2003/0198895 | A1 | 10/2003 | Toma et al. |
| 2004/0018319 | A1 | 1/2004 | Waldfried et al. |
| 2004/0058090 | A1 | 3/2004 | Waldfried et al. |
| 2004/0069410 | A1 | 4/2004 | Moghadam et al. |
| 2004/0096586 | A1 | 5/2004 | Schulberg et al. |
| 2004/0096593 | A1 | 5/2004 | Lukas et al. |
| 2004/0096672 | A1 | 5/2004 | Lukas et al. |
| 2004/0099952 | A1 | 5/2004 | Goodner et al. |
| 2004/0101633 | A1 | 5/2004 | Zheng et al. |
| 2004/0102031 | A1 | 5/2004 | Kloster et al. |
| 2004/0102032 | A1 | 5/2004 | Kloster et al. |
| 2004/0161532 | A1 | 8/2004 | Kloster et al. |
| 2004/0170760 | A1 | 9/2004 | Meagley et al. |
| 2004/0185679 | A1 | 9/2004 | Ott et al. |
| 2005/0064698 | A1 | 3/2005 | Chang et al. |
| 2005/0194619 | A1 | 9/2005 | Edelstein et al. |
| 2006/0024976 | A1 | 2/2006 | Waldfried et al. |
| 2006/0027929 | A1 | 2/2006 | Cooney et al. |
| 2006/0110931 | A1 | 5/2006 | Fukazawa et al. |
| 2006/0145304 | A1 | 7/2006 | Boyanov et al. |
| 2006/0197881 | A1 | 9/2006 | Kang et al. |
| 2007/0020952 | A1 * | 1/2007 | Lin et al. ................ 438/778 |
| 2008/0009141 | A1 | 1/2008 | Dubois et al. |
| 2008/0132055 | A1 | 6/2008 | Nguyen et al. |

FOREIGN PATENT DOCUMENTS

| | | |
|---|---|---|
| WO | WO95/07543 | 3/1995 |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.

Humayun et al., "Method for Forming Porous Films by Porogen Removel Combined Wtih In SITU Surface Modification", Novellus Corporation, U.S. Appl. No. 10/404,693, filed Mar. 31, 2003, pp. 1-32.

Tipton et al., "Method of Porogen Removal From Porous Low-K Films Using UV Radiation", Novellus Systems, Inc., U.S. Appl. No. 10/672,311, filed Sep. 26, 2003, pp. 1-27.

Jan, C.H., et al, *90NM Generation, 300mm Wafer Low k ILD/Cu Interconnect Technology*, 2003 IEEE Interconnect Technology Conference.

Wu et al., U.S. Appl. No. 10/789,103, entitled: Methods for Producing Low-K CDO Films With Low Residual Stress.

Wu et al., U.S. Appl. No. 10/820,525, entitled: Methods for Producing Low-K CDO Films With Low Residual Stress.

Wu et al., U.S. Appl. No. 10/800,409, entitled: Methods for Producing Low-K CDO Films.

U.S. Appl. No. 10/016,017, filed Dec. 12, 2001.

U.S. Appl. No. 10/125,614, filed Apr. 18, 2002.

U.S. Appl. No. 10/202,987, filed Jul. 23, 2002.

Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.

Gangpadhyay et al., "The First International Surface Cleaning Workshop," Northeastern University, Nov. 11-14, 2002.

Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

Humayun et al., "Method for Forming Porous Films by Porogen Removal Combined With In Situ Modification", U.S. Appl. No. 10/404,693, filed Mar. 31, 2003, Office Action dated Mar. 15, 2005.

Tipton et al., "Method of Porogen Removal From Porous Low-K Films Using UV Radiation", U.S. Appl. No. 10/672,311, filed Sep. 26, 2003, Office Action dated Sep. 7, 2004.

Tipton et al., "Method of Porogen Removal From Porous Low-K Films Using UV Radiation", U.S. Appl. No. 10/672,311, filed Sep. 26, 2003, Office Action dated Dec. 28, 2004.

Tipton et al., "Method for Removal of Porogens From Porous Low-K Films Using Supercritical Fluids", U.S. Appl. No. 10/672,305, Office Action dated Mar. 22, 2005.

Bandyopadhyay et al., "Method to Improve Mechanical Strength of Low-K Dielectric Film Using Modulated UV Exposure", U.S. Appl. No. 10/825,888, filed Apr. 16, 2004.

R.D. Miller et al., "Phase-Separated Inorganic-Organic Hybrids for Microelectronic Applications," MRS Bulletin, Oct. 1997, pp. 44-48.

Jin et al., "Nanoporous Silica as an Ultralow-$k$ Dielectric," MRS Bulletin, Oct. 1997, pp. 39-42.

Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.

Asoh et al., "Conditions for Fabrication of Ideally Ordered Anodic Porous Alumina Using Pretextured Al," Journal of the Electrochemica Society, 148 (4) B152-B156 (2001) pp. B152-B156.

Holland et al., "Nonlithographic Technique for the Production of Large Area High Density Gridded Field Sources," J. Vac. Sci. Technol. B 17(2), Mar./Apr. 1999, pp. 580-582.

Masuda et al. "Highly Ordered Nanochannel-Array Architecture in Anodic Alumina," App. Phys. Lett. 71(19), Nov. 1997, pp. 2770-2772.

Clube et al., White Paper from Holotronic Technologies SA; downloaded from www.hdotronic.com/whitepaper/fine-patt.pdf on Mar. 12, 2002.

Meli et al., "Self-Assembled Masks for the Transfer of Nanometer-Scale Patterns into Surfaces: Characterization by AFM and LFM", Nano Letters, vol. 2, No. 2, 2002, 131-135.

"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution for Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20,2004, pp. 1-24.

Niu et al., "Methods for Improving the Cracking Resistance of Low-K Dielectric Materials", U.S. Appl. No. 10/860,340, filed Jun. 2, 2004.

Niu et al., "Methods for Improving the Cracking Resistance of Low-K Dielectric Materials", U.S. Appl. No. 10/860,340, Office Action dated Mar. 2, 2005.

Niu et al., "Methods for Improving the Cracking Resistance of Low-K Dielectric Materials", U.S. Appl. No. 10/860,340, Final Office Action dated Jun. 13, 2005.

Wang et al., "Plasma Detemplating and Silanol Capping of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method for Improving Mechanical Properties of Low Dielectric Constant Materials", U.S. Appl. No. 10/849,568, filed May 18, 2004.

Fox et al., "Methods for Producing Low-Stress Carbon-Doped Oxide Films With Improved Integration Properties", U.S. Appl. No. 10/987,208, filed Nov. 12, 2004.

Van Den Hoek et al., "VLSI Fabrication Processes for Introducing Pores Into Dielectric Materials," U.S. Appl. No. 11/050,621, filed Jan. 31, 2005.

Draeger et al., "Creation of Porosity in Low-K Films by Photo-Disassociation of Imbedded Nanoparticles," U.S. Appl. No. 11/146,456, filed Jun. 6, 2005.

Wu et al., "Methods for Producing Low Stress Porous Low-K Dielectric Materials Using Precursors With Organic Functional Groups", U.S. Appl. No. 10/927,777, filed Aug. 27, 2004.

Wu et al., "Methods for Improving Integration Performance of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Office Action mailed Jul. 13, 2005, from U.S. Appl. No. 10/672,311.

U.S. Office Action mailed Jul. 27, 2005, from U.S. Appl. No. 10/785,235.

U.S. Office Action mailed Aug. 24, 2005, from U.S. Appl. No. 10/404,693.

U.S. Office Action mailed Sep. 1, 2005, from U.S. Appl. No. 10/672,305.

Tanikella, et al., "Rapid Curing of Positive Tone Photosensitive Polybenzoxazole Based Dielectric Resin by Variable Frequency Microwave Processing", pp. 1-25.

Tanikella, et al., "Variable Frequency Microwave Curing of Benzocyclobutene", pp. 1-32.

Hubbard, et al., "Low Temperature Curing of Polyimide Wafer Coatings", Abstract, Submitted to the "*Advances in Wafer Level and Chip Scale Packaging*" session; STS: IEMT, SEMICON West 2004, 1 page.

Hubbard, et al., "Low Temperature Curing of Polyimide Wafer Coatings" 3 pages.

U.S. Office Action mailed Jul. 12, 2006, from U.S. Appl. No. 10/672,305.

U.S. Office Action mailed Aug. 14, 2007, from U.S. Appl. No. 10/404,693.

U.S. Office Action mailed Feb. 2, 2007, from U.S. Appl. No. 10/672,305.

Willibrordus Gerardus Maria van den Hoek et al., "VLSI Fabrication Processes for Introducing Pores Into Dielectric Materials," U.S. Appl. No. 11/606,340, filed Nov. 28, 2006.

Cabarrocas et al., "Plasma production of nanocrystalline silicon particles and polymorphous silicon thin films for large-area electronic devices," Pure Appl. Chem., vol. 74, No. 3, pp. 359-367, 2002.

Kim et al., "Particle formation during low-pressure chemical vapor deposition from silane and oxygen: Measurement, modeling, and film properties," J. Vac. Sci. Technol. A 20(2), Mar./Apr. 2002, pp. 413-423.

Suh et al., "Modeling particle formation during low-pressure silane oxidation: Detailed chemical kinetics and aerosol dynamics," J. Vac. Sci. Technol. A 19(3), May/Jun. 2001, pp. 940-951.

Ostraat, et al., "Ultraclean Two-Stage Aerosol Reactor for Production of Oxide-Passivated Silicon Nanoparticles for Novel Memory Devices," Journal of the Electrochemical Society, 148 (5) G265-G270 (2001).

Girshick et al., "Numerical Modeling of Gas-Phase Nucleation and Particle Growth during Chemical Vapor Deposition of Silicon," Journal of the Electrochemical Society, 147 (6) 2303-2311 (2000).

Fonzo, et al., "Focused nanoparticle-beam deposition of patterned microstructures," Applied Physics Letters, vol. 77, No. 6, Aug. 7, 2000, pp. 910-912.

Notice of Allowance mailed May 22, 2006, from U.S. Appl. No. 10/672,311.

Allowed Claims from U.S. Appl. No. 10/672,311.

Notice of Allowance mailed Oct. 3, 2006, from U.S. Appl. No. 10/785,235.

Allowed Claims from U.S. Appl. No. 10/785,235.

U.S. Office Action mailed Dec. 12, 2007, from U.S. Appl. No. 11/146,456.

U.S. Office Action mailed Nov. 28, 2007, from U.S. Appl. No. 10/807,680.

R.J. Lewis, Sr., Hawley's Condensed Chemical Dictionary, 12$^{th}$ edition, Van Norstrand Reinhold Co., New York, 1993 (no month), excerpts pp. 916-918 & 1123-1124.

Cho et al., "Hydroxyl Bond Removal and Film Densification Method for Oxide Films Using Microwave Post Treatment", U.S. Appl. No. 11/280,076, filed Nov. 15, 2005.

U.S. Office Action mailed Dec. 27, 2005, from U.S. Appl. No. 10/789,103.

U.S. Office Action mailed Dec. 23, 2005, from U.S. Appl. No. 10/800,409.

U.S. Office Action mailed Feb. 7, 2006, from U.S. Appl. No. 10/672,305.

U.S. Office Action mailed Dec. 20, 2005, from U.S. Appl. No. 10/672,311.

U.S. Office Action mailed Dec. 20, 2005, from U.S. Appl. No. 10/849,568.

U.S. Office Action mailed Jan. 9, 2006, from U.S. Appl. No. 10/785,235.

Subramonium et al., "Pulsed PECVD Method for Modulating Hydrogen Content in Hard Mask", U.S. Appl. No. 11/318,269, filed Dec. 23, 2005.

U.S. Office Action mailed Feb. 28, 2006, from U.S. Appl. No. 10/404,693.

U.S. Office Action mailed Mar. 29, 2006, from U.S. Appl. No. 10/800,377.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appl. No. 10/849,568.

U.S. Office Action mailed May 2, 2006, from U.S. Appl. No. 11/050,621.

U.S. Office Action mailed Jun. 15, 2006, from U.S. Appl. No. 10/800,409.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Sep. 8, 2006, from U.S. Appl. No. 10/404,693.

U.S. Office Action mailed Sep. 7, 2006, from U.S. Appl. No. 10/820,525.

Wu et al., "Methods for Fabricating High Hardness/Modules Low Dielectric Constant Materials," Novellus Systems, Inc., U.S. Appl. No. 11/369,658, filed Mar. 6, 2006, pp. 1-33.

Dhas et al., "Method of Reducing Defects in PECVD TEOS Films," Novellus Systems, Inc., U.S. Appl. No. 11/396,303, filed Mar. 30, 2006, pp. 1-21.

U.S. Final Office Action mailed Jul. 9, 2008, from U.S. Appl. No. 10/982,654.

U.S. Final Office Action mailed Apr. 3, 2008, from U.S. Appl. No. 10/982,654.

U.S. Final Office Action mailed Mar. 18, 2008, from U.S. Appl. No. 10/404,693.

U.S. Final Office Action mailed Jul. 10, 2008, from U.S. Appl. No. 10/807,680.

U.S. Final Office Action mailed Jul. 25, 2008, from U.S. Appl. No. 11/146,456.

U.S. Office Action mailed Aug. 5, 2008, from U.S. Appl. No. 11/280,076.

Notice of Allowance mailed Nov. 10, 2008, from U.S. Appl. No. 11/146,456.

Supplemental Notice of Allowance mailed Nov. 10, 2008, from U.S. Appl. No. 11/146,456.

U.S. Office Action mailed Dec. 4, 2008, from U.S. Appl. No. 10/982,654.

Office Action mailed Jun. 11, 2010 for U.S. Appl. No. 12/606,920.

U.S. Final Office Action mailed Jan. 5, 2010, from U.S. Appl. No. 11/369,311.

U.S. Office Action mailed Feb. 5, 2009, from U.S. Appl. No. 11/606,340.

Van Den Hoek, et al., "VLSI Fabrication Processes for Introducing Pores Into Dielectric Materials," U.S. Appl. No. 11/606,340, filed Nov. 28, 2006.

Notice of Allowance mailed Jul. 28, 2009, from U.S. Appl. No. 11/606,340.

Allowed Claims U.S. Appl. No. 11/606,340.

Cho, Seon-Mee, et al., "Hydroxyl Bond Removal and Film Densification Method for Oxide Films Using Microwave Post Treatment," U.S. Appl. No. 12/534,573, filed Aug. 3, 2009.

U.S. Office Action mailed Aug. 20, 2009, from U.S. Appl. No. 11/369,311.

Van Den Hock, et al., "VLSI Fabrication Processes for Introducing Pores Into Dielectric Materials," U.S. Appl. No. 12/606,920, filed Oct. 27, 2009.

Draeger, et al., "Creation of Porosity in Low-K Films by Photo-Disassociation of Imbedded Nanoparticles," U.S. Appl. No. 12/369,384, filed Feb. 11, 2009.

* cited by examiner

METHOD FOR POROGEN REMOVAL AND MECHANICAL STRENGTH ENHANCEMENT OF LOW-K CARBON DOPED SILICON OXIDE USING LOW THERMAL BUDGET MICROWAVE CURING

CROSS-REFERENCE TO RELATED APPLICATIONS

This application is related to U.S. patent application Ser. No. 10/800,377, filed on Mar. 11, 2004, titled "Method And Apparatus For UV Exposure Of Low Dielectric Constant Materials For Porogen Removal And Improved Mechanical Properties," U.S. patent application Ser. No. 10/672,311, filed on Sep. 26, 2003, titled "Method of Porogen Removal from Porous Low-k Films Using UV Radiation," U.S. patent application Ser. No. 10/404,693, filed on Mar. 31, 2003, titled "Method for Forming Porous Films by Porogen Removal Combined with In Situ Surface Modification," U.S. patent application Ser. No. 10/672,305, filed on Sep. 26, 2003, titled "Method for Removal of Porogens from Porous Low-k Films Using Supercritical Fluids," and U.S. patent application Ser. No. 10/295,965 filed Nov. 15, 2002, titled "System for Deposition of Mesoporous Materials." These applications are incorporated herein by reference in their entirety for all purposes.

FIELD OF THE INVENTION

This invention relates to methods and apparatus for preparing porous low-k dielectric films for integrated circuits. More specifically, the invention employs microwave radiation to (a) remove porogen material from a precursor dielectric film, (b) lower the dielectric constant of dielectric film and/or (c) improve the mechanical strength of dielectric film.

BACKGROUND

There is a general need for materials with low dielectric constants (low-k) in the integrated circuit manufacturing industry. Using low-k materials as the inter-metal and/or inter-layer dielectric between conductive interconnects reduces the delay in signal propagation due to capacitive effects. The lower the dielectric constant of the dielectric, the lower the capacitance of the dielectric and the lower the RC delay of the integrated circuit (IC).

Low k dielectrics are conventionally defined as those materials that have a dielectric constant lower than that of silicon dioxide—that is k<4. Typical methods of obtaining low-k materials include doping silicon dioxide with various functional groups containing carbon or fluorine. While fluorinated silicate glass (FSG) generally has k of 3.5-3.9, carbon-doping methods can further lower the k value to ~1.9. Current efforts are focused on developing low-k dielectric materials with k values less than 2.5 for the most advanced technology needs. These ultra low-k (ULK) dielectrics can be obtained by incorporating air voids within a low-k dielectric matrix, creating a porous dielectric material.

Methods of fabricating porous dielectrics typically involve forming a film (sometimes referred to herein as a "precursor film") containing two components: a porogen (typically an organic material such as a hydrocarbon) and a structure former or dielectric material (e.g., a silicon containing material). Once the precursor film is formed on the substrate, the porogen component can be removed, leaving a structurally intact porous dielectric matrix. Techniques for removing porogens from the precursor film include, for example, a thermal process in which the substrate is heated to a temperature sufficient for the breakdown and vaporization of the organic porogen. These thermal processes, however, have certain drawbacks. Substrate temperatures generally need to be high (i.e., greater than about 400 degrees Celsius) with exposure times typically on the order of hours. As is well known in the field, these conditions are unacceptable for backend-of-line applications as they can damage copper-containing devices.

Although the general approach of introducing voids into the dielectric will reduce the dielectric constant of the film, it will also reduce the density of the film and may sacrifice the mechanical strength and the thermo-mechanical properties of the film. Since dielectric films can be subjected to severe thermal and mechanical stresses in IC processes such as chemical mechanical polishing (CMP) and packaging, these porous films must have sufficient mechanical strength to withstand these processes. Therefore, improved methods of forming mechanically robust low-k porous films are needed.

SUMMARY

The present invention addresses these needs by providing improved methods and apparatus for curing a low-k dielectric material on a substrate using microwave radiation. The use of microwave radiation allows the preparation of low-k films to be accomplished at low temperatures (less than around 400 degrees C.). According to various embodiments, microwave radiation is used to remove porogen from a precursor film and/or to increase the strength of the resulting porous dielectric layer. In a preferred embodiment, methods involve (a) forming a precursor film that contains a porogen and a structure former on a substrate, (b) exposing the precursor film to microwave radiation to remove the porogen from the precursor film to thereby create voids within the dielectric material and form the porous low-k dielectric layer and (c) exposing the dielectric material to microwave radiation in a manner that increases the mechanical strength of the porous low-k dielectric layer. In some embodiments, exposure to microwave radiation is used to lower the dielectric constant of the film. Microwave annealing is not limited to porous films but may be used to increase the strength and/or lower the dielectric constant of any porous or non-porous dielectric film.

In preferred embodiments, the substrate is a semiconductor wafer. Methods of the invention may be performed in a single-wafer process or batch process. The precursor film is preferably formed by co-depositing the porogen with the structure former. Preferably, the porogen is an organic material and the structure former is a silicon-containing material. In preferred embodiments, the structure former is produced from a silane, an alkylsilane, an alkoxysilane, a siloxane (particularly the carbon-containing varieties), and combinations thereof. Examples of suitable siloxanes include octamethyl cyclotetrasiloxane (OMCTS), tetramethylcyclotetrasiloxane (TMCTS), dimethyldimethoxysilane (DMDMOS), and diethoxymethylsilane (DEMS). These and other carbon containing compounds can be used to form carbon-doped oxides (CDOs).

One preferred class of porogen compounds is the polyfunctional cyclic non-aromatic compounds. Good examples of such compounds are the alpha-terpiene (ATRP) compounds and limonenes. Another class of porogen is the template forming compounds such as certain block copolymer materials, such as polyethylene oxide (PEO)-polypropylene oxide (PPO) block copolymers, used to form ordered mesoporous films. Examples of these types of compounds are various organic silanes, such as di-tert-butyl-silane, that possess bulky organic groups. All of the above porogen compounds can be driven from the deposited silicon-oxygen matrix to leave behind small pores.

Microwave frequency, exposure time and porogen required for porogen removal and mechanical strengthening depend on a number of factors, including the composition of the dielectric, and the type of porogen used In general, microwave frequency can vary broadly during microwave curing between 0.3 GHz and 300 GHz. In preferred embodiments, the frequency is between about 1-4 GHz, more preferably about 2.45 GHz. Exposure time is preferably below about 5 minutes, and most preferably below about 60 seconds. Power is preferably about 3 kW. The preferred condition depends on the size of the chamber, the MW cavity design, and the characteristics of the material.

Substrate temperatures can vary broadly during the microwave exposure and may range between about minus 10 degrees Celsius and 600 degrees Celsius, preferably below about 400 degrees Celsius. In particularly preferred embodiments, the temperature is between about 20 and 400 degrees Celsius. These and other features and advantages of the invention will be described in detail below with reference to the associated drawings.

BRIEF DESCRIPTION OF THE DRAWINGS

The following detailed description can be more fully understood when considered in conjunction with the drawings in which.

DETAILED DESCRIPTION OF A PREFERRED EMBODIMENT

Introduction

In the following description, numerous specific details are set forth in order to provide a thorough understanding of the present invention, which pertains to porogen removal of a porous precursor film. The porous precursor film may be a carbon-doped oxide (CDO). The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves preparing dielectric films using microwave radiation. In certain embodiments, microwave radiation may be used to remove porogen from a dielectric precursor film. The methods may involve forming a low-k dielectric material by way of a "precursor film" or "precursor layer" that contains a "structure former," typically a dielectric material, which serves as a backbone of the porous network, and a porogen, which generates the porous regions within the dielectric film. Hence, the porogen and dielectric matrix typically exist as separate phases within the precursor layer. In methods of this invention, the porogen is removed from the precursor film to create a porous low-k dielectric layer. Within the precursor film, the porogen resides in locations that will subsequently become void locations in the final dielectric film.

UV-mediated porogen removal has been described in the above-referenced applications, particularly U.S. patent application Ser. No. 10/800,377, referenced above. While the invention is not limited to any particular theory of operation, it should be noted that while UV radiation typically interacts directly with porogen bonds to facilitate porogen decomposition or another breakdown mechanism, microwave radiation is believed to cause intramolecular vibrations and/or rotations, which in turn raise the internal heat of the porogen molecules, causing porogen bonds to break. UV-mediated porogen removal often requires thermal energy to supply the necessary activation energy to break porogen bonds; microwave-mediated removal typically does not. It is because of this that in many embodiments, microwave-mediated porogen removal may be accomplished at lower substrate temperatures than possible with UV-mediated porogen removal, especially below about 300° C.

Microwave radiation may be used in certain embodiments to increase the mechanical strength of a dielectric film, including both porous and non-porous films. Mechanical strength may be manifested in terms of hardness, modulus, intrinsic stress, cohesive strength, etc. Intrinsic stress, hardness and modulus are well defined within the art and will not be discussed in detail herein. Measures of film hardness presented herein may be made with any suitable apparatus including a nano-indenter device. Measure of intrinsic film stress may be made with any suitable apparatus including a stress gauge.

One way to characterize cohesive strength in a dielectric layer is via a "cracking threshold" measurement. This is a measure of thickness of a dielectric film on a blank substrate (e.g., a flat 200 or 300 mm wafer) that can be deposited without forming a crack. In a typical experiment, the dielectric is deposited to various thicknesses using a single set of process conditions. The resulting wafer (with dielectric layer) is set aside without disturbance for a period of time (e.g., one day) and then examined for cracks. The greatest thickness at which no crack is observed is the cracking threshold. For many processes, the cracking threshold is measured in micrometers.

Microwave radiation may also be used in some embodiments to the lower the k-value (i.e., dielectric constant) of the dielectric film. k-value may be lowered by reducing the polarizability and/or increasing porosity of the dielectric material. In other embodiments, the k-value remains more or less constant during exposure to microwave radiation.

Figure 1A:
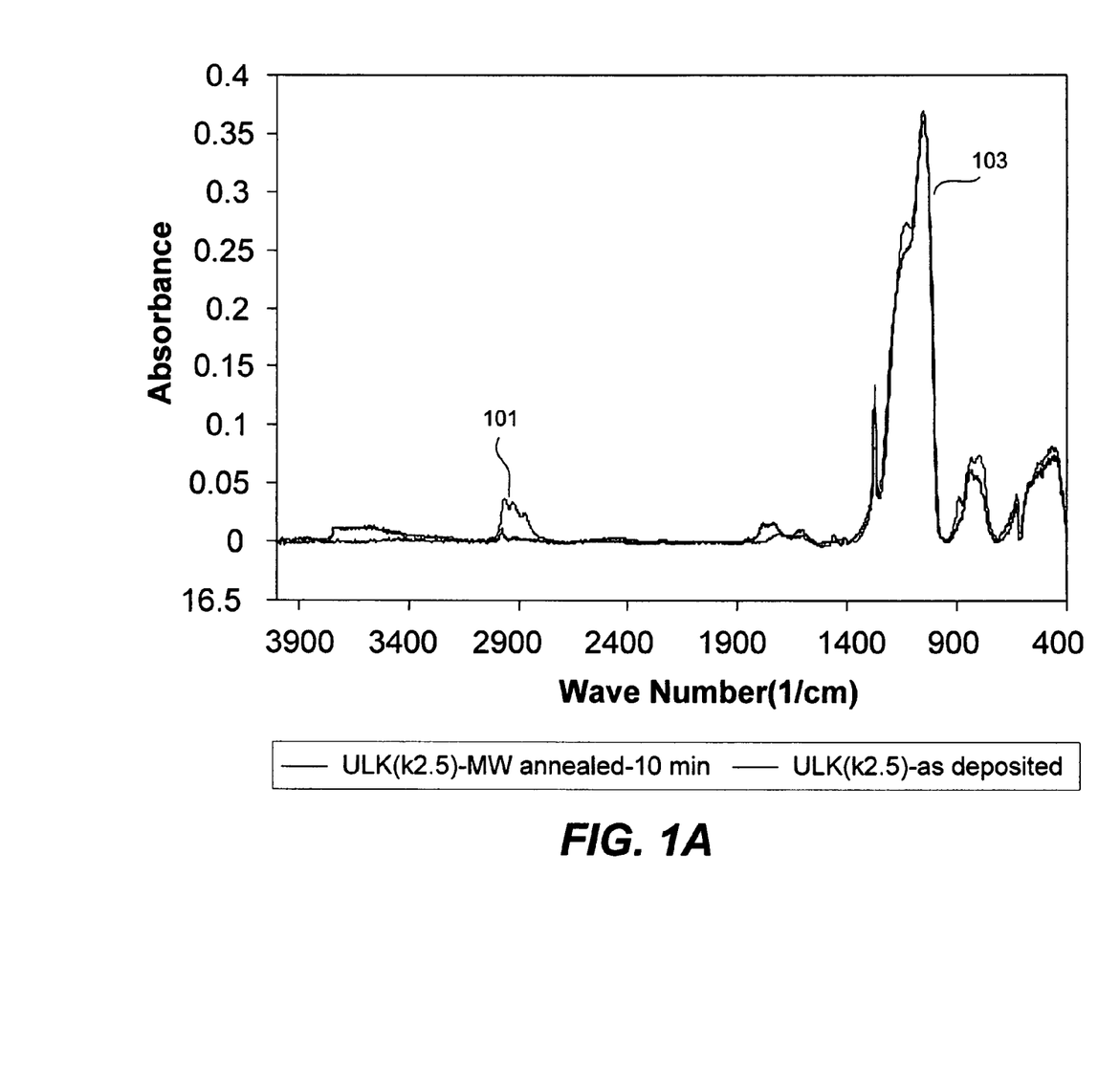
FIG. 1A presents FTIR spectra of a dielectric layer on substrate pre- and post-microwave annealing.
Figure 1B:
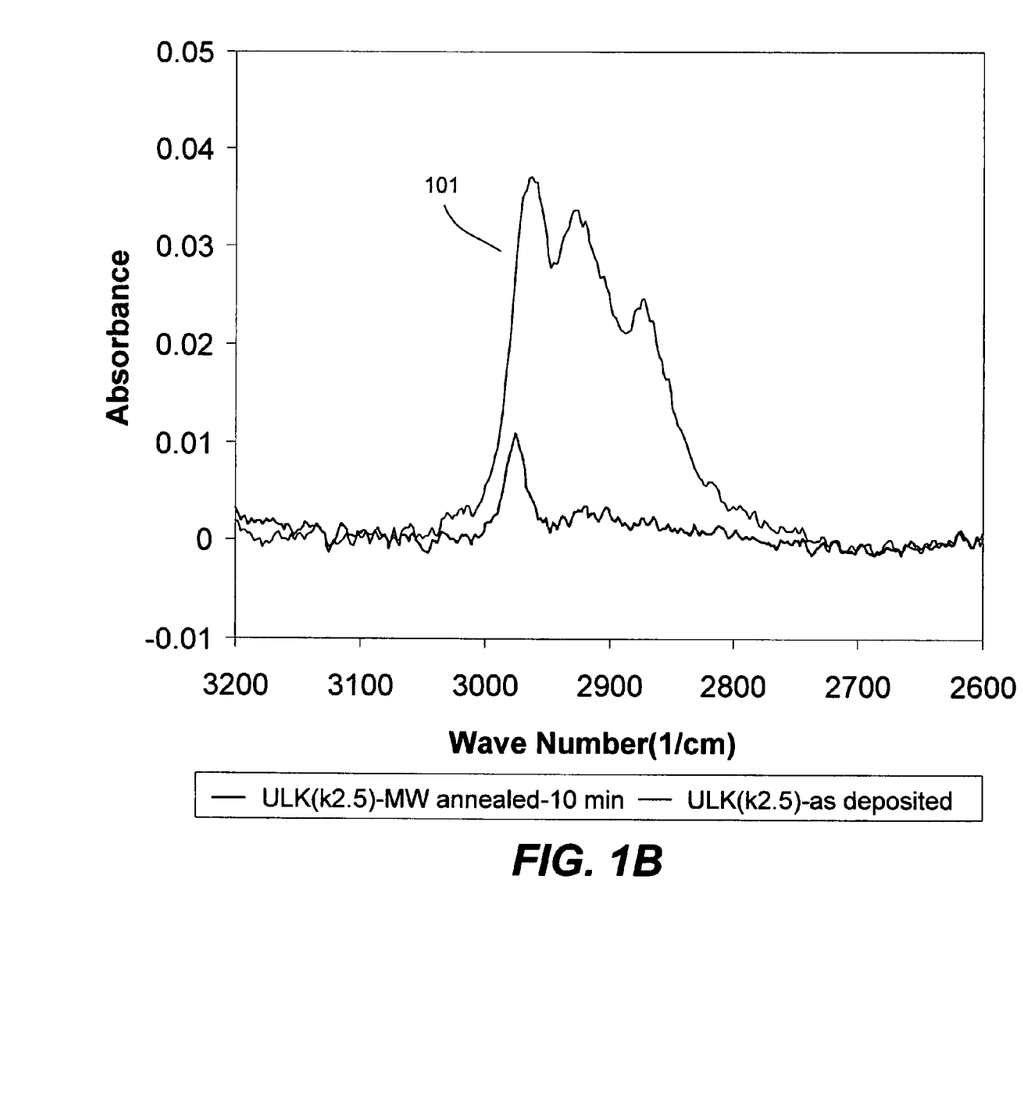
FIG. 1B presents a blown-up view of the $CH_x$ region of the FTIR spectra shown in FIG. 1A.
Figure 1C:
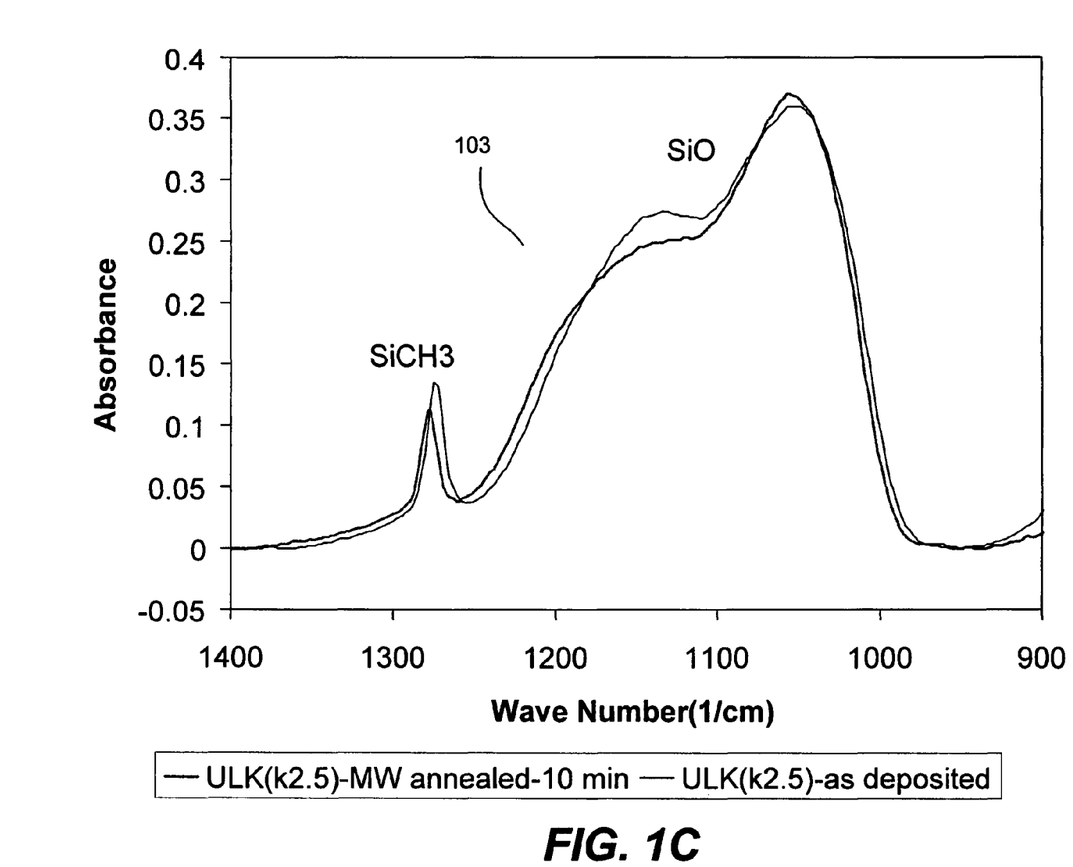
FIG. 1C presents a blown-up view of the $SiCH_3$ and SiO regions of the FTIR spectra shown in FIG. 1A.

FIGS. 1A-C present FTIR spectra of a dielectric layer on substrate pre- and post-microwave exposure. Reference number 101 of FIG. 1A shows the $CH_x$ region of the spectra, which corresponds to the amount of porogen present. A blown-up view of this area is also shown in FIG. 1B. As can be seen in FIG. 1B, the $CH_x$ peak is significantly reduced by the microwave treatment—indicating that the porogen has been removed. Reference number 103 of FIG. 1A shows the $SiCH_3$ and SiO peaks. $SiCH_3$/SiO peak area ratio is inversely related to hardness; the post-microwave exposure ratio is reduced, indicating that hardness increased. It should also be noted that the amount of $SiCH_3$ and SiO correlates to the k-value; reduction in the peak area ratio of $SiCH_3$ to SiO indicates increase decrease of k-value as well as increase in hardness.

Process Flow

Figure 2:
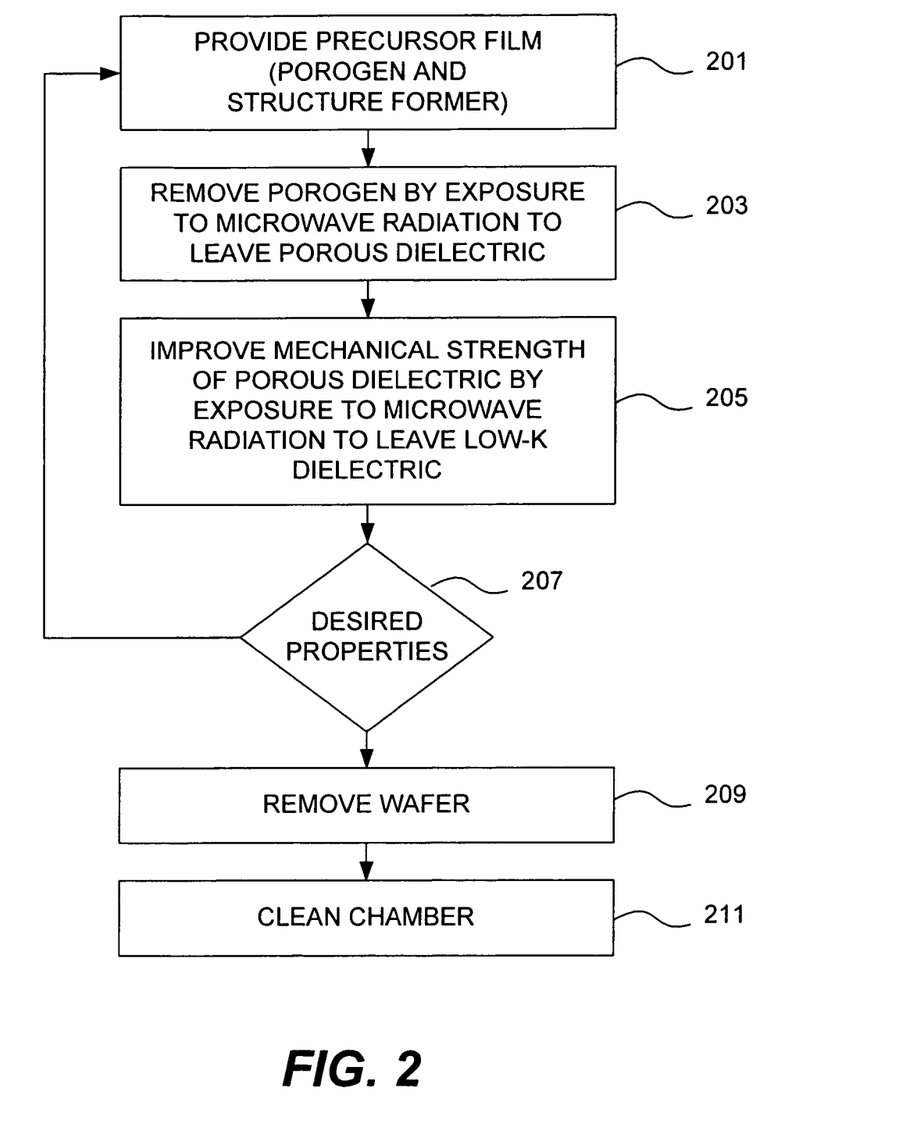
FIG. 2 is a flowchart summarizing stages of example implementations of the invention.

FIG. 2 is a flow chart depicting one general high-level process flow in accordance with some embodiments of the present invention. Initially, a precursor film is provided on a substrate as indicated by a process block 201. As mentioned previously, a precursor film contains a porogen and a structure former for the dielectric backbone. In many embodiments of commercial application, the substrate is a partially fabricated integrated circuit or other partially electronic semiconductor device.

As discussed further below, various techniques for forming a precursor film may be employed. A typical approach involves co-depositing the porogen with the structure former precursor using a low temperature PECVD (plasma enhanced chemical vapor deposition) process. As indicated, other processes such as spin-on methods may be employed. Other suitable deposition techniques may include supercritical infusion, print-on, and dip coating. It is noted that the invention is not limited to any particular type of deposition method.

Next, the precursor film is processed to remove porogen. In the embodiment depicted in FIG. 2, the film is exposed to microwave radiation to mediate removal of at least a portion of the porogen to leave a porous dielectric film. See process block 203. In alternate embodiments not pictured in FIG. 2, the porogen may be removed by any other method including thermal decomposition or volatilization, plasma decomposition, supercritical extraction, reaction with a supercritical medium and/or UV mediated porogen removal.

As indicated, the microwaves are believed to increase the internal energy of the porogen by causing intramolecular vibrations and/or rotations. This facilitates porogen decomposition or other breakdown mechanism. In a typical case, the porogen decomposes into lower molecular weight components that exist in the vapor phase or can be easily vaporized and thereby removed from the precursor film Alternatively the microwave radiation can indirectly facilitate breakdown of the porogen. In one example, this is accomplished by the microwave radiation interacting with a compound other than the porogen to convert that compound into a species that can attack the porogen and thereby facilitate its removal. For example, the microwave radiation may convert molecular oxygen or other oxygen containing compounds present in a reaction chamber to produce a strong oxidant, which can then react with and break down the porogen. The decomposition products of the porogen can be volatilized and removed from the precursor film.

Typical frequencies of microwave radiation range from 1-4 GHz; however the frequency of the microwave radiation may be tuned to cause intramolecular vibrations in the particular porogen used. Intensity may range from 100 W-7 kW and in certain embodiments, from 1-4 kW. 3 kW is used in a particular embodiment. The preferred conditions depend on the size of the chamber, cavity design, and material characteristics.

Note that the operations 201 and 203 can be conducted in a single vessel or in two separate vessels, one for forming the precursor layer and another for exposing the porogen to microwave radiation or a microwave activated species. Also, it is possible for a wafer to be treated in this manner in one chamber and then moved to a different chamber where the decomposed porogen is removed by heating, contact with a solvent, etc. In general, however, for mechanical simplicity, it is preferred to perform as many operations as possible in a single chamber.

After the porogen is removed, the porous dielectric film is further exposed to microwave radiation to mechanically strengthen the film. See block 205. Typical microwave frequencies range between about 1-4 GHz, with 2.45 GHz used in a particular embodiment. Microwave power typically ranges between about 100 W and 7 kW, and more preferably between about 1 kW and 4 kW, for example 3 kW in one embodiment. Of course, power requirements may depend on the size of the substrate and chamber design.

Microwave exposure times can vary broadly with typical exposure times ranging between about 1 second and 60 minutes. In preferred embodiments, the process of 205 occurs in an inert environment. Such environments may include an inert gas such as nitrogen, helium or argon in the reaction chamber. In some embodiments of the invention, a more reactive ambient comprising a gas such as hydrogen may be used during microwave exposure. A combination of the reactive and inert gases mentioned above may also be used. In preferred embodiments, microwave exposure is performed in a no-oxygen ambient, to prevent film oxidation. The pressure during microwave exposure is typically between 1 µTorr and 760 Torr.

In some embodiments, all or some of steps 203 and 205 may occur simultaneously.

Although not shown in the diagram of FIG. 2, microwave radiation may be used to strengthen non-porous dielectric films, as well as porous films. Also, the invention is not limited to strengthening porous films as formed in by the methods described in FIG. 2, but include strengthening a dielectric film as formed by any method.

Referring back to FIG. 2, as indicated by decision 207, for thicker dielectric film applications, operations 201, 203 and 205 may be repeated performed until the desired film properties are achieved. Once the porous dielectric is sufficiently strengthened and is of sufficient thickness, the wafer is removed from the reaction chamber (block 209). Next, the reaction chamber may optionally be cleaned (block 211). In one embodiment the chamber is cleaned by exposing a reactive gas to another dose of microwave radiation. This cleaning procedure is for removing porogen residues that may have coated the inside of the chamber after the porogen removal process (block 203).

Process Parameters

Precursor Films

As noted above, in many embodiments of the present invention, a precursor film including a structure former and a porogen is formed. A porous dielectric film may then be formed by exposing the precursor film to microwave radiation, thereby removing the porogen.

The precursor film may be formed by any of numerous techniques. In some methods, the structure former and porogen are co-deposited in one process. Any suitable deposition technique may be used, including spin-coating processes, print-on, dip coating, thermal process and chemical vapor deposition—particularly plasma enhanced chemical vapor deposition (PECVD). In alternative methods, the structure former and porogen are deposited separately in a two-phase process. For example, in some mesoporous films, a template-forming precursor, solvent and catalyst are mixed and applied by spin-coat or print-on methods to form a template in a first process phase, then a silica-forming precursor is introduced to the formed template in a second process step such as supercritical infusion into a polymer matrix. Depending on the application, the thickness of the precursor film may range between about 30 nanometers and 3 micrometers.

Generally, a porogen is any removable material that defines void regions in a dielectric matrix. Frequently, though not necessarily, the porogen is an organic material. In methods of the present invention, the porogen is removed from the precursor film by a microwave mediated method. In a preferred approach, the microwave radiation causes intramolecular vibrations and/or rotations in the porogen to facilitate chemical decomposition or other modification of the porogen and produce products that are more easily removed than the porogen itself. In another approach, the microwave exposure occurs in the presence of oxygen to create an oxidizing environment (e.g., ozone and/or oxygen radicals) that oxidizes the porogen. The oxidation products are more easily removed than the porogen itself. Note that in this approach, some microwave radiation may cause intramolecular vibrations in the porogen as well. In general, the microwave radiation is tuned for absorption by the porogen in the first approach and tuned for oxygen activation in the second approach. Thus, in the first approach, the microwave radiation is preferably tuned to a vibrational or rotational resonance frequency (or frequencies) in the porogen. Of course, the porogen may be chosen to match the characteristics of an available microwave source frequency.

In some cases the porogen is randomly distributed throughout the precursor film and other cases it is ordered in a repeating structure throughout the film. In the case of an ordered porous or mesoporous dielectric matrix, the porogen is frequently referred to as a "template." One type of ordered porogen, for example, is a block copolymer that has chemically distinct components (e.g. PEO polyethylene oxide and PPO polypropylene oxide) that segregate into separate phases. The discussion herein will refer to porogen and porogen materials in general and are intended to include any type of porogen, ordered or non-ordered, organic or inorganic, unless otherwise specified.

Frequently, the porogen is a hydrocarbon. The following is a non-comprehensive list of precursor films (listed by type of porogen molecules) suitable for the present invention. "Low temperature porogens" are deposited below about 200 degrees C. and "high temperature porogens" are deposited above about 200 degrees C.

| Low Temperature Porogens | High Temperature Porogens |
|---|---|
| Aldehydes: | Alkenes: |
| CH2O, CH3CHO | C2H4, CH3—CH=CH2, etc |
| Alkenes: | Terpiene family compounds |
| C2H4, CH3—CH=CH2, etc | (e.g. alpha-terpiene) |
| di-tert-butyl silane | Terpiene derivatives |
|  | (such as terpinol) |
| Esters | Compounds with multiple active |
|  | sites (e.g., ENB) |

One preferred class of porogens are polyfunctional cyclic non-aromatic compounds, particularly alpha-terpienes (ATRP) and limonenes. Suitable alpha-terpiene derivatives include, for example, alpha-terpiene itself, substituted alpha-terpienes, and multi-ring compounds containing the alpha-terpiene nucleus. Suitable limonene derivatives include, for example, limonene itself, substituted limonenes, and multi-ring compounds containing the limonene nucleus. Other compounds include functional groups such as —CH=CH$_2$, —CH=CH—, —C≡CH, —C≡C—, —C=O, —OCH$_3$. A typical example of these compounds is 1,2,3,4-tetramethyl-1,3-cyclopentadiene (TMCP) (C$_9$H$_{14}$). Three-dimensional multi-ring compounds such as 5-ethylidene-2-norbornene (ENB) are also suitable.

In some cases, the porogen and structure former reside in the same compound. That is, the porogen is a removable moiety in a compound that contains moieties serving as structure formers covalently bonded to moieties serving as the porogen. Nominally, the porogen moiety is a large bulky organic substituent that will leave pores in the resulting dielectric film. Examples of such species are organic silanes such as di-tert-butylsilane, phenyldimethylsilane, and alkoxysilanes such as 5-(bicycloheptenyl)methyldimethoxysilane (BMDS) and 5-(bicycloheptenyl)triethoxysilane (BTS) (SiC$_{13}$O$_3$H$_{24}$). These compounds may be deposited using CVD or spin on methods, for example. As indicated, the structure former serves as a backbone for the resulting porous low-k film.

Many different chemical compositions may be used as the structure former. In some embodiments, the composition includes silicon and oxygen. Sometimes it also includes carbon (carbon-doped oxide, CDO) and/or other elements and even metals.

Examples of precursors for structure formers include silanes, alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)).

Note that one example of a silane is di-tert-butylsilane, described above. The thickness of the precursor film (and hence the resulting dielectric layer) depends upon the ultimate application. As an example, the thickness may range between about 50 to 1500 angstroms for a hard mask application. For an interlayer dielectric or packaging application, the thickness may range from 1500 angstroms up to about 2 to 3 microns. In some cases, extra thickness is required to provide some amount of sacrificial dielectric to accommodate a subsequent planarization or polishing step.

Microwave Radiation

Frequency

It will be appreciated by those skilled in the art that the microwave radiation used with the invention encompasses all microwave frequencies. Methods of the invention utilize microwave radiation for various operations including facilitating porogen removal, mechanically strengthening the dielectric film, lowering the k-value of the dielectric film and cleaning a chamber after use. Some operations may more effectively be implemented using microwave radiation with a particular range of frequencies, i.e., frequency distribution. However, in particular embodiments, for all operations, low frequency microwave radiation, i.e., between 1 and 4 GHz is used.

In the case of porogen removal, in certain embodiments, the microwave frequency should generally match the resonance characteristics of the porogen bonds and/or the oxidizing agent if used. In cases where microwaves are used to raise the internal energy of the porogen, the typical frequencies suitable for most types of porogens range between about 1 and 4 GHz. Note that the radiation may comprise one (most intensity exists around one frequency, e.g., 2.45 GHz) or a broader range of frequencies.

Frequencies between about 0.3 and 4 GHz, more preferably between about 1 and 4 GHz, and even more preferably at about 2.45 GHz have been found to work well for the porogen removal, mechanical strengthening and k-value reduction operations. In particular, these frequencies result in significantly higher reduction in the orientation polarization of the dielectric material as compared to higher frequencies. For example, application of microwave frequency of 7-9 GHz results in orientation polarization that is on the order of ten times as high as for 1-4 GHz. As discussed above, reducing polarization reduces the k-value; thus application of microwave frequency in this range is significantly superior for low-k applications than higher microwave frequencies. It also has been found that these low frequencies are suitable for removal of organic porogens. Use of higher frequencies may take a significantly longer time.

In preferred embodiments in which microwave radiation is used for porogen removal as well as post-removal treatments, the same frequency and other process conditions are used for the post-removal treatments (to provide mechanical strengthening and/or k-value reduction) as for the porogen removal. In this way, the process and process apparatus may be simplified.

Power and Exposure Time

Microwave power and exposure time are largely functions of each other (with higher power requiring less time), as well as frequency and film density and thickness. Power may range from 100 W-7 kW, with 1-3 KW preferred, and 3 kW particularly preferred. Typical exposure times may range from seconds to tens of hours. Preferably, for commercial applications, the exposure time will be about 5 minutes or less. In a preferred embodiment, the exposure time ranges from about 1 second up to 60 minutes.

Of course, power should be high enough and exposure time long enough to remove porogen, increase strength, or lower k-value as desired. For many applications, acceptable film hardness levels range between about 0.5 GPa and 3 GPa (and more preferably greater than 0.8 GPa). Increasing exposure time results in increasing hardness, though to some extent the exposure time is a strong function of the microwave power; at certain threshold power, desired hardening may not occur even after prolonged exposure. Note that microwave treatments in accordance with this invention may sometimes improve other mechanical properties besides just hardness. For example, they may increase cohesive strength of the dielectric film. Preferably, the cohesive strength, as measured by cracking threshold, is at least about 2 micrometers.

In many embodiments, exposure to microwave radiation will not significantly raise the k-value or will reduce k-value. For most applications, acceptable k values range between about 2 and 2.9 (more preferably between about 2.2 and 2.7). As discussed in U.S. application Ser. No. 10/800,377, to a certain extent, k-value tends to increase with hardness, so it may be necessary to optimize film hardness for a desired dielectric constant.

Temperature

Substrate temperature during microwave radiation exposure typically ranges between about −10 and 600 degrees Celsius. However, as discussed above, the use of microwave radiation allows lower thermal budget than thermal or UV porogen removal and annealing. The temperature is thus between about 20 and 400 degrees Celsius in certain embodiments. For example, the temperature may be below about 300 degrees Celsius, below about 100 degrees Celsius or around room temperature according to various embodiments.

Pressure and Ambient Conditions

Pressure typically ranges from 0 to 760 Torr, with atmospheric pressure preferred. Microwave exposure may be performed in the presence of gases such as argon, hydrogen, helium, nitrogen, air or mixtures thereof. In some embodiments, an oxygen-free ambient is preferred to prevent film oxidation.

Other Process Conditions

The microwave radiation may be applied continuously or pulsed. Also in preferred embodiments the microwave radiation is applied in TE and/or TM mode.

Apparatus

The present invention can be implemented in many different types of apparatus. In preferred embodiments, the apparatus will include one or more chambers (sometimes referred to as process vessels) that house one or more wafers and are suitable for wafer processing. At least one chamber will include a microwave source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during procedures of the invention. For certain operations in which the wafer temperature is to be controlled, the apparatus may include a heating or cooling platen.

Figure 3:
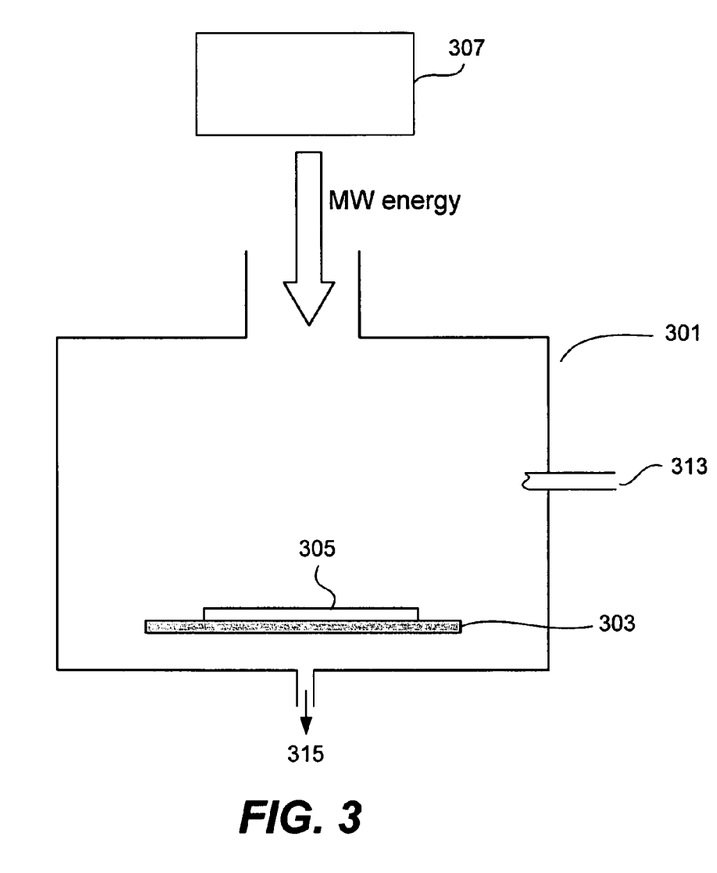
FIG. 3 is a schematic representation of an apparatus suitable for microwave porogen removal and microwave mechanical strengthening.

FIG. 3 is a simplified schematic diagram of an example chamber 301 in accordance with the invention. Chamber 301 is capable of holding vacuum and/or containing gases at pressures above atmospheric pressure. For simplicity, only one chamber 301 is shown. It is noted that in preferred embodiments, chamber 301 is one chamber in a multi-chambered apparatus (entire apparatus not shown), although chamber 301 could alternatively be part of a stand-alone single chambered apparatus. Suitable multi-chambered apparatus, for example, include the modified Novellus Sequel and Vector systems. In a preferred embodiment of the invention chamber 301 can process multiple wafers simultaneously.

Wafer 305 rests on rotating quartz table 303 in a position such that radiation from a microwave source can irradiate wafer 305. Wafer 305 may also be in contact with a heater (not shown) that can heat the wafer to defined temperatures, or a chiller to cool the wafer. Chamber 301 is configured with a gas inlet 315, which is connected to a gas source (not shown), and with a vacuum outlet 313, which is connected to a vacuum pump (not shown). The amount of gas introduced into chamber 301 can be controlled by valves and mass flow controller (not shown) and pressure is measured by pressure gauge (not shown).

In this example, microwave source 307 is mounted outside the chamber 301. In alternate embodiments, the microwave may be housed inside chamber 301. Note that this is only an example of a suitable configuration. In general, it is preferable that the microwave source or sources are arranged to provide uniform microwave radiation to the wafer.

During normal operation, chamber 301 is first evacuated via vacuum outlet 313, and then the inert gas (e.g., argon, nitrogen) is introduced via gas inlet 313 to a certain chamber pressure or the chamber is left under vacuum. Next, microwave source 307 is turned on to provide uniform microwave radiation of an appropriate frequency to remove porogen material and leave a dielectric layer on wafer 305. Chamber 301 is typically under vacuum to remove volatilized porogen residues or under continuous purge to remove any of the porogen evolving during microwave exposure. Inert gas is again introduced via gas inlet 313 or the chamber is left under vacuum. Next, the microwave source is turned or left on to mechanically strengthen the dielectric layer on wafer 305. In some embodiments, microwave radiation is applied directly on the wafer. In others, a remote microwave source can be mounted on chamber 301. In a preferred embodiment, a remote microwave source is used to ionize the gases fed into the chamber, and, in addition, the substrate is irradiated by a second source mounted on the microwave chamber. Typically, wafer 305 is then removed from chamber 301.

Note that the apparatus depicted in FIG. 3 is only an example of a suitable apparatus and other designs for other methods involved in previous and/or subsequent processes may be used. For example, methods of the invention may be used with a standard PECVD chamber used to deposit the precursor layer if the chamber is equipped with a microwave radiation source. Some supercritical fluid chamber systems may also be configured to include microwave radiation sources. Many of these systems may also be used to perform the post-porogen removal microwave (or UV) mechanical strengthening, silanol capping and/or post-porogen removal chamber cleaning procedures. Obviously, in these cases, the chamber system will likely be pumped out between each of the process steps.

EXPERIMENTAL

The following example provides details illustrating aspects of the present invention. This example is provided to exemplify and more clearly illustrate these aspects of the invention and is in no way intended to be limiting.

Dielectric precursor film of 1 micron was formed on a substrate by simultaneously flowing a DEMS (a structure former) and limonene (a porogen) into a PECVD chamber containing the substrate. The substrate was then removed from the chamber and placed in a microwave oven and exposed to microwave radiation of 2.45 GHz for 10 minutes. The microwave exposure was performed at ambient pressure and in an air atmosphere. Microwave power was 1000 W and the radiation was applied in pulses. Temperature was around room temperature.

FIGS. 1A-C show FTIR spectra of the film pre- and post-microwave curing. Reference numeral 101 in FIGS. 1A and 1B shows the $CH_x$ peak, which corresponds to the amount of porogen present. 94% of the porogen was removed by exposure to the microwaves. The degree of porogen removal corresponds to exposure time and power of the radiation; higher power and/or longer exposure time would be expected to result in an even higher degree of porogen removal. Porogen removal also has the effect of lowering the k-value of the film by increasing porosity.

Reference numeral 103 in FIGS. 1A and 1C show the $SiCH_3$ and SiO peaks. The $SiCH_3$/SiO peak area ratio was reduced from 2.7% to 1.9% by exposure to microwave radiation, indicating that the hardness increased. It should be noted than an OH peak was observed post-curing due to the fact that the microwave exposure took place in an air ambient rather than an oxygen-free ambient.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of preparing a porous low-k dielectric layer on a substrate, the method comprising:
    (a) providing a precursor film on the substrate, the precursor film comprising a dielectric material and a porogen;
    (b) exposing the precursor film to microwave radiation to remove the porogen to thereby create voids within the dielectric material and form the porous low-k dielectric layer; and
    (c) exposing the dielectric material to microwave radiation in a manner that increases the mechanical strength of the porous low-k dielectric layer, wherein at least part of (b) and (c) occur simultaneously.

2. The method of claim 1 wherein (a) comprises forming a precursor film on the substrate, the precursor film comprising the porogen and a structure former.

3. The method of claim 1 wherein the substrate temperature is below about 400° C. during microwave exposure.

4. The method of claim 1 wherein the substrate temperature is below about 300° C. during microwave exposure.

5. The method of claim 1 wherein the substrate temperature is below about 100° C. during microwave exposure.

6. The method of claim 1 wherein the microwave power ranges between about 100 W and 7 kW.

7. The method of claim 6 wherein the microwave power ranges between about 1 kW-3 kW.

8. The method of claim 1 wherein the microwave frequency is between about 1 and 4 GHz.

9. The method of claim 8 wherein the microwave frequency is about 2.45 GHz.

10. The method of claim 1, wherein the substrate is a semiconductor wafer.

11. The method of claim 1, wherein the precursor film comprises a porogen and a silicon-containing structure former.

12. The method of claim 11 wherein the precursor film is formed by co-depositing the porogen with the structure former.

13. The method of claim 11, wherein the structure former is produced from at least one of a silane, an alkylsilane, an alkoxysilane, siloxane, carbon-doped variation thereof, or combination thereof.

14. The method of claim 13, wherein the structure former is produced from diethoxymethylsilane (DEMS), octamethylcyclotetrasiloxane (OMCTS), tetramethylcyclotetrasiloxane (TMCTS), dimethyldimethoxysilane (DMDMOS), carbon-doped oxides or a combination thereof.

15. The method of claim 1, wherein the porogen comprises a polyfunctional cyclic non-aromatic compound.

16. The method of claim 15, wherein the polyfunctional cyclic non-aromatic compound is a limonene compound.

17. The method of claim 1, wherein (b) comprises exposing the precursor film to pulses of microwave radiation.

18. The method of claim 1, wherein (b) is performed under an ambient comprising at least one of argon, nitrogen, helium, hydrogen and a combination thereof.

19. The method of claim 1, wherein the porous low-k dielectric layer has a k-value of about 2.5 or lower.

* * * * *